(12) United States Patent
Diehl

(10) Patent No.: US 11,003,210 B2
(45) Date of Patent: May 11, 2021

(54) ENCLOSURE FOR ELECTRONIC DEVICES

(71) Applicant: Gordon Diehl, Setauket, NY (US)

(72) Inventor: Gordon J. Diehl, Setauket, NY (US)

( * ) Notice: Subject to any disclaimer, the term of this patent is extended or adjusted under 35 U.S.C. 154(b) by 70 days.

(21) Appl. No.: 15/581,293

(22) Filed: May 1, 2017

(65) Prior Publication Data

US 2018/0317332 A1 Nov. 1, 2018

(51) Int. Cl.
*G06F 1/16* (2006.01)
*H05K 5/00* (2006.01)
*H05K 5/02* (2006.01)

(52) U.S. Cl.
CPC ............ *G06F 1/1628* (2013.01); *H05K 5/00* (2013.01); *H05K 5/0086* (2013.01); *H05K 5/023* (2013.01)

(58) Field of Classification Search
CPC ......... H05K 5/023; G06F 1/16; G06F 1/1613; G06F 1/1628; G06F 1/1633; G06F 1/1656; A45C 2011/003
USPC ....................................................... 206/320
See application file for complete search history.

(56) References Cited

U.S. PATENT DOCUMENTS

| | | | | |
|---|---|---|---|---|
| 2011/0260014 A1* | 10/2011 | Chen | ...................... | F16M 11/10 248/157 |
| 2012/0224323 A1* | 9/2012 | Yang | ..................... | F16M 11/041 361/679.55 |
| 2012/0300394 A1* | 11/2012 | Norfolk | ................ | G06F 1/1628 361/679.55 |
| 2014/0124521 A1* | 5/2014 | Brown | ................... | H05K 5/023 220/756 |
| 2015/0163929 A1* | 6/2015 | Wang | ..................... | H05K 5/023 361/679.01 |
| 2015/0244408 A1* | 8/2015 | Chen | ................... | H04B 1/3888 455/575.8 |
| 2017/0295656 A1* | 10/2017 | Tsai | ....................... | H05K 5/023 |

* cited by examiner

*Primary Examiner* — Steven A. Reynolds
*Assistant Examiner* — Javier A Pagan
(74) *Attorney, Agent, or Firm* — Peter J. Esser

(57) ABSTRACT

An improved enclosure for electronic devices providing device protection against physical damage and improved functionality and ergonomics by means of a multiplicity of selectable and adjustable grasping, mounting, and supporting points.

6 Claims, 4 Drawing Sheets

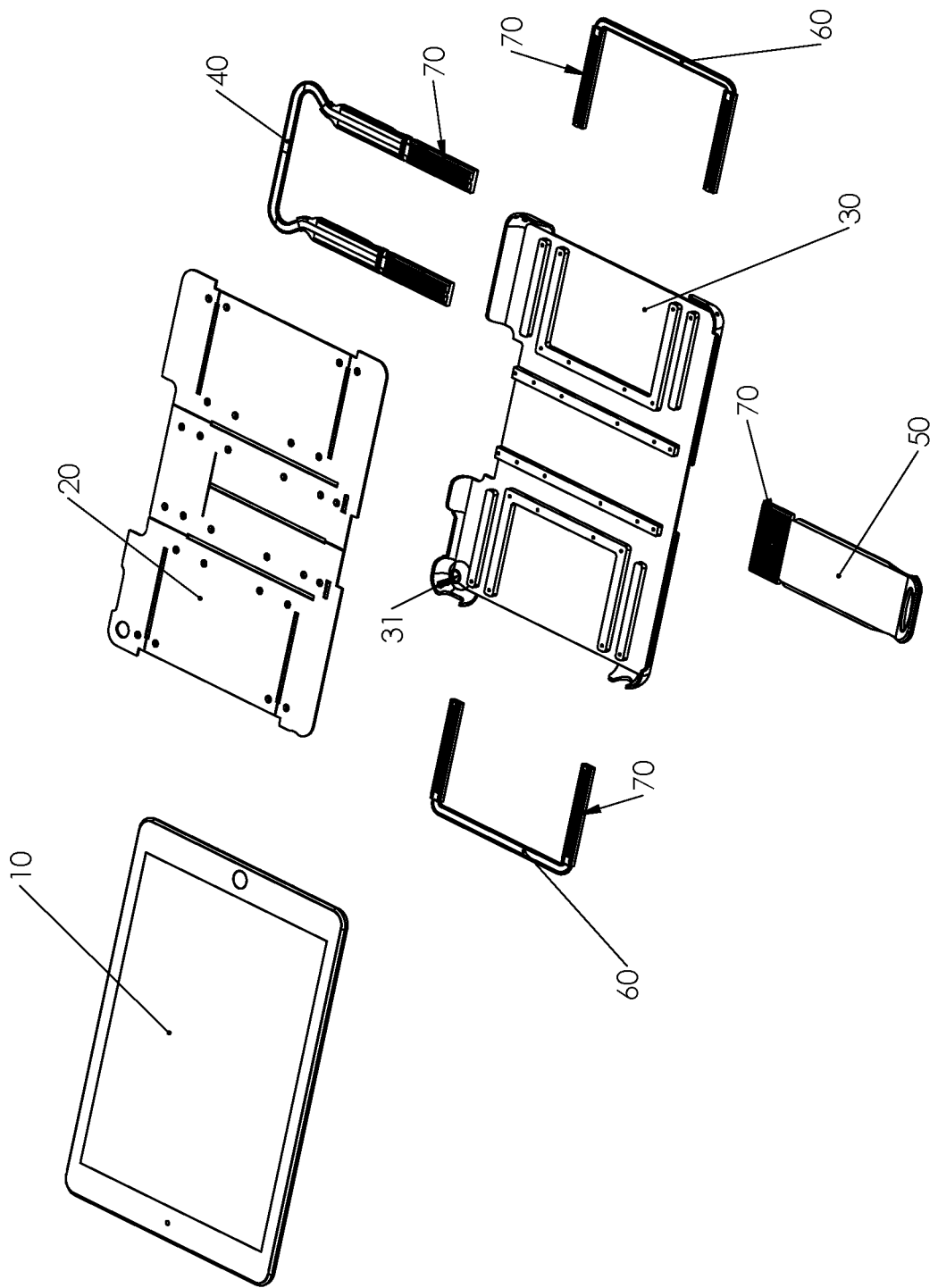

ENCLOSURE FOR ELECTRONIC DEVICES

BACKGROUND OF THE INVENTION

The present invention relates to enclosures for electronic devices and more specifically to more ergonomic and functional protective housings for portable electronic devices including tablets computers, mobile phones, and related gear.

Portable devices such as mobile telephones, notebook computers, phablets and similar gear are inherently vulnerable to physical shock, breakage, and other related damage. Such devices are more likely than non-portable or static devices to be accidentally dropped, scratched, or to have items or substances dropped, or spilled on them. Depending on the severity of accidental contact or impact, the device may be damaged, necessitating costly and time-consuming repairs, or even rendered useless. As designers seek to create ever more functional, more visually striking, otherwise appealing devices, what is often overlooked is the greater functionality and overall resistance to accidental damage that would otherwise optimize the functionality as well as the lifespan of such devices. One common downside to the evolving phenomenon of devices being fitted with ever-larger displays is a relative lack of suitable grasping points. Increasingly, device displays or screens occupy nearly the entire frontal surface of such devices, with the typical device screen bezel diminishing in size with each new generation of device. In some cases, displays dominate the front side of a device and extend over to the edges of a device as in the case of curved displays. One negative outcome of this development in device technology is the limitation presented by the need to actually grasp a device in order to operate it. When a user holds such a device, the imagery or data displayed on the screen is easily partly obscured by the user's own fingers. Similarly, a cumbersome and less than secure grip may be required to utilize a device's photographic capabilities. Accordingly, users often change grips or grasp the devices by their edges or otherwise manipulate the devices in a way that increases the risk of dropping the device. Also, for certain applications such as recording video with such devices, it is nearly impossible to maintain a steady grasp on the device for prolonged durations, as the only suitable grasping points are the general perimeter of the case or enclosure of such devices.

A number of hardened accessory or aftermarket cases have been designed, and some successfully brought to market, for such portable devices. Moreover, designers and manufacturers of such devices are increasingly incorporating more durable materials and designs into their factory-original products. Whether integrated into the device itself or as accessories, such protective enclosures ideally will shield these devices from possible damage. Cases can also be used to enhance the functionality and capabilities of the device. Ideally, a case will serve to protect a device, may provide added functionality to a device, and should be as unobtrusive and ergonomic as possible, while concurrently offering value in terms of purchase price and longevity. At present, however, there are no device designs which inherently provide a high degree of protection for the electronics and other components independent of a given device's immediate, factory-assembled enclosure which concurrently provide a high degree of ergonomics and added functionality.

Therefore, there is a need for cases for portable electronic devices that will protect the devices, while at the same time enhance the functionality and usability of the devices.

BRIEF SUMMARY OF THE INVENTION

The invention comprises a protective, multifunction enclosure of modular construction for electronic devices enabling greatly improved functionality and stability, a high degree of tactile response, and significant protection of an electronic device against impact and other physical damage.

The essential design of the device entails in part a pair of interlocking casing members for receiving an electronic device, with integral, friction-fitted handles that concurrently may serve as mounting points and which may be selectively deployed and locked in an open, partially open, or retracted and closed position relative to the casing members. The invention may either receive and partially enclose an external electronic device via a friction fit as an accessory or aftermarket unit, or may be incorporated permanently into the rear surface of an electronic device as an original equipment component. When the electronic device is thus partially enclosed, the operator of the electronic device may choose from numerous options in terms of positioning the electronic device with an unusually high degree of stability and firm grip. The operator may also orient and statically place the electronic device within the enclosure on a horizontal or vertical surface in a variety of positions such as a substantially horizontal or also a substantially vertical position, with a range of angles being achieved by engaging the various handle-mount components integrated in the rear of the case.

By deploying one of more of the handle-mounts, the invention further permits for mounting the device on a wall or hanging the device from any other suitable surface in a horizontal or vertical orientation in either a landscape or portrait orientation.

The invention presents an extreme degree of image stabilization functionality to the operator of the electronic device. This results from the enclosure incorporating bilaterally symmetrical handle-mounts integrated in the sides of the enclosure and a top handle-mount which is located along the top edge and orthogonal to the side-positioned handle-mounts. The operator may, by deploying one or several of the handle-mounts, maintain an exceptionally firm and steady grasp on the electronic device, suitable for purposes of employing the electronic device as a substantially motion-stabilized video camera, or even for greater ease in playing games or engaging in other activities normally associated with the aforementioned electronic devices. Especially in the case of the former application, a key benefit is that the end or side fields of the electronic device screen are not obscured by the user's fingers, as would normally be the case.

The great advantage of the invention is that a broad range of possible static placements of the protected, partially enclosed electronic device may be achieved securely and with extreme ease of operation. A further advantage of the invention is that it enables the operator of an electronic device to grasp and otherwise manipulate the device with an extremely secure grip in a broad range of orientations. Another advantage of the invention is that it provides a high degree of protection against accidental physical damage to the device enclosed within the invention. Yet another significant advantage of the invention is that it may be produced according to multiple methods of manufacture, such as machining from solid stock materials, injection molding, casting, or deposition of material, as in digital printing.

The invention comprises seven basic components:
1. The main electronic device 10

Consists of the input, output, screen and peripherals hardware and may be a core element of the enclosure with the enclosure forming the rear of the device, or a stand-alone element.

2. The device backing plate 20

Forms a rear case member and establishes receiving channels for the mounting of slidably-affixed side handle-mounts 60, top handle 40, and handgrip-strut 50.

3. The side handle-mounts 60

Provide a means for stably grasping, mounting, hanging, or otherwise manually gripping or statically positioning the electronic device.

4. The top handle-mount 40

Provides a means for stably grasping, mounting, hanging, or otherwise manually gripping or statically positioning the electronic device.

5. The handgrip-strut 50

Provides a means for stably grasping, mounting, hanging, or otherwise manually gripping or statically positioning the electronic device.

6. The integral case backing plate 30

Provides a solid backing to the enclosure, and provides rail members which engage positively with side- and top-handle-mount members and handgrip-strut member friction members 70 for gradual deployment and firm locking of side-and top-handle-mount members and handgrip-strut member.

7. The lens aperture 31

Provides a cut-out for a rearward-oriented optical lens of the electronic device.

8. The friction members 70

Provides the side- and top-handle-mount members and handgrip-strut member graduated travel and locking points for deployment externally from and retraction into the combined device backing plate and integral case backing plate assembly via waveform detents.

The current invention seeks to provide an improved protective and multifunction enclosure as either an accessory to an electronic device or at the level of a device as produced by an original equipment manufacturer. This system provides the added advantage of protecting the enclosed components while obviating the need for additional peripheral equipment for purposes of providing a steady, motion-free base such as a tripod for use when the device is engaged in, for example, a photography or video recording mode.

Various appropriate materials may be used for the bodies of the various modules including but not limited to: thermoplastics, polymers, thermosetting polymers, fiberglass, fiber reinforced recycled plastics, and metals, all of which may be formed or machined according to various techniques suitable to the materials.

BRIEF DESCRIPTION OF THE DRAWING

The following drawings are attached in explanation of the invention, the features of which are referenced within the detailed description of the invention. Elements in the drawing figures are not necessarily drawn to scale. Note that, although the example presented of the case is generally rectangular as illustrated throughout the following drawings, said shape may be of any practicable multi-sided geometry suitable for enclosing a range of electronic devices.

In order to better understand the drawings, the following legend is provided:

| | |
|---|---|
| Main electronic device | 10 |
| Device backing plate | 20 |
| Integral casing backing plate | 30 |
| Optical lens aperture | 31 |
| Top handle-mount | 40 |
| Handgrip-strut | 50 |
| Side handle-mount | 60 |
| Friction members | 70 |

It should be noted that the receiving members defining the channels for the friction members of the side- and top-handle-mounts are not numbered.

Figure 1:
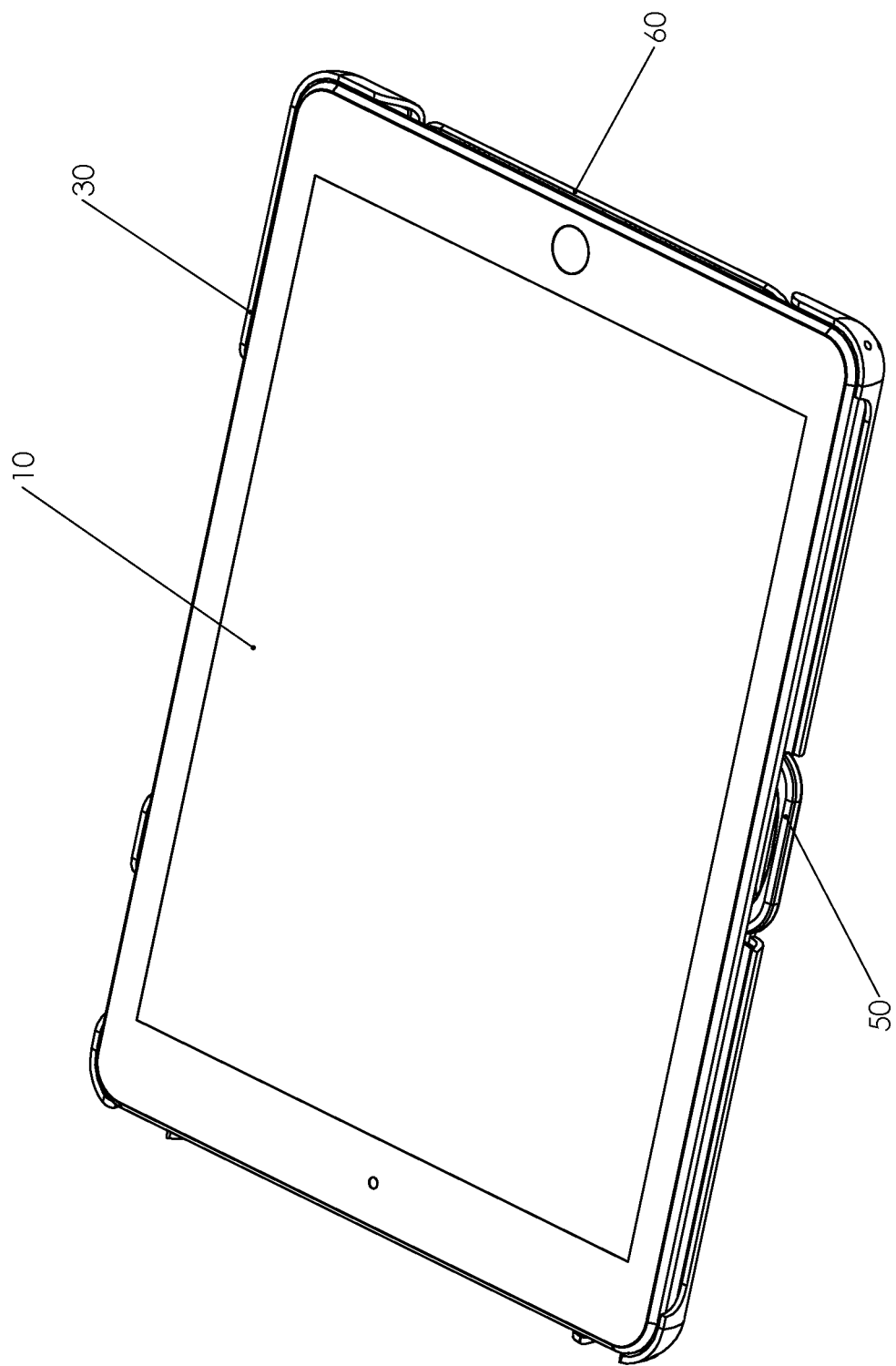

FIG. 1: This figure presents a top view of the entire invention showing all of the exposed constituent elements 30, 50, and 60 assembled as a unit and partially enclosing an electronic device 10. The depiction may also represent the completed assembly of constituent elements where constituent elements 30, 50, and 60 are assembled as a unit and incorporate the electronic device 10 as an original element connected to the entire assembly by means of device backing plate 20 (not depicted) being an integral element of the electronic device. Importantly, FIG. 1 depicts the invention with all handle-mounts and the handgrip-strut retracted and not deployed.

Figure 2:
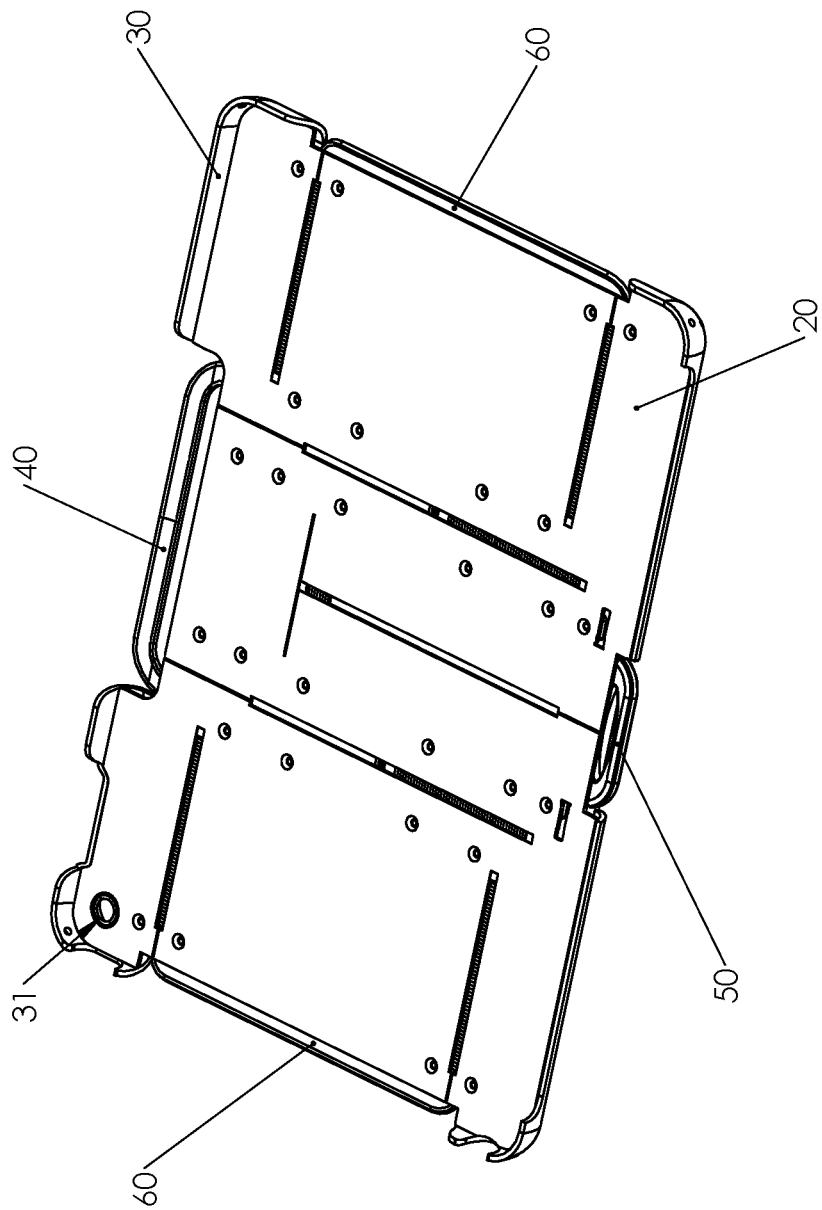
Figure 2A:
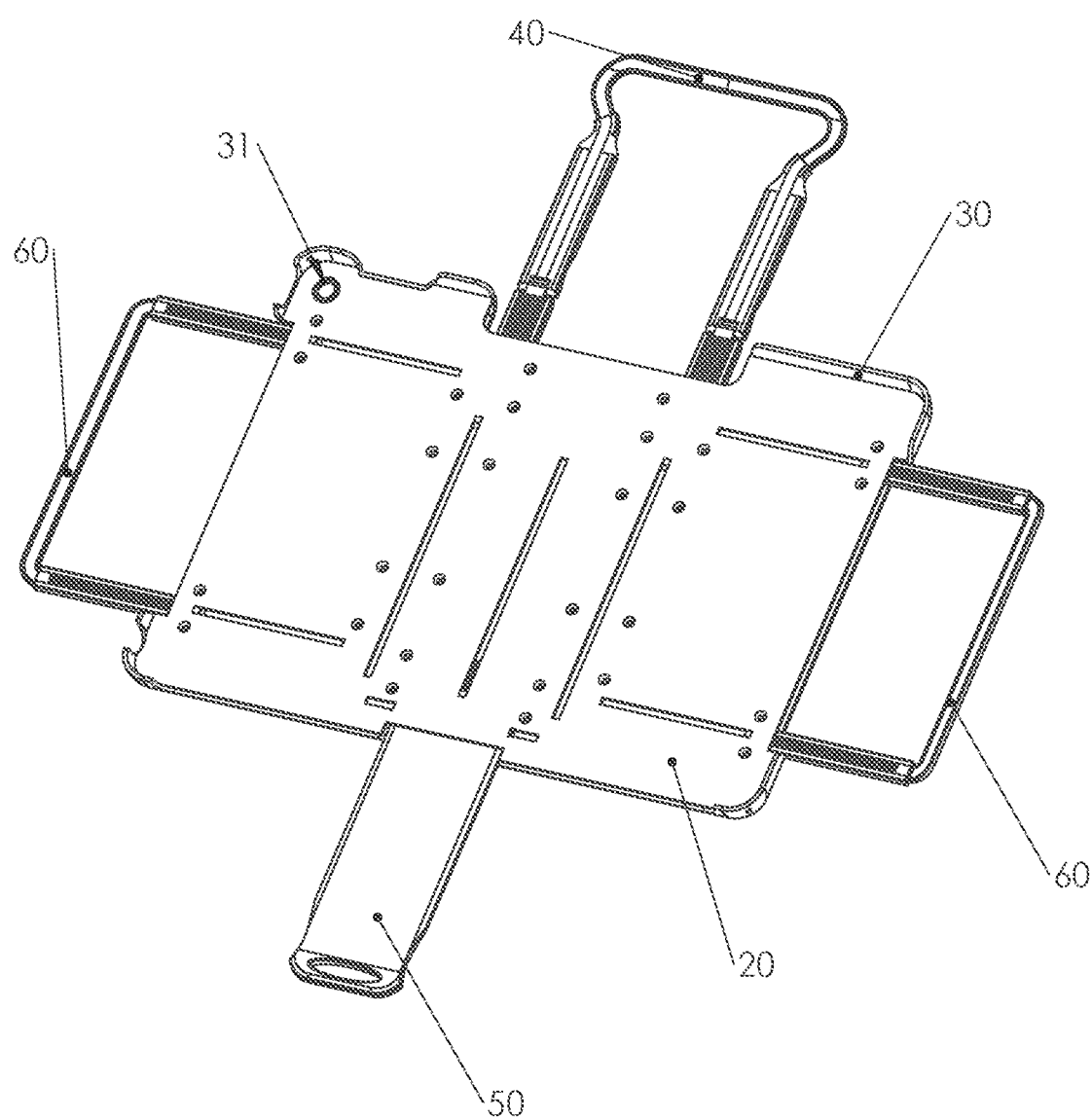

FIG. 2: This figure presents a top view of the entire invention showing the constituent elements 20, 30, 31, 40, 50, and 60 assembled as a unit and prepared to receive an electronic device, with the side- and top-handle-mounts and handgrip-strut retracted.

FIG. 3: This figure presents an exploded view of all components 10, 20, 30, 31, 40, 50 60, and 70.

DETAILED DESCRIPTION OF THE INVENTION

The invention is an improved protective enclosure for electronic devices which comprises a receiving body for an electronic device consisting of a device backing plate and integral case backing plate mated to a number of handles and handgrip elements which also serve as static mounting points, struts, and bracing points.

The invention, in order of assembly, includes:
1. The main electronic device 10 where the invention may be made a part of original equipment,
2. The device backing plate 20 and integral case backing plate 30 which when joined receive the main electronic device 10 either as an accessory device or original equipment device, in which case device backing plate is made a part of the main electronic device 10,
3. The top handle-mount 40 which is received by the sub-assembly consisting of the device backing plate 20 and integral backing plate 30 and may be deployed outwardly in a graduated manner therefrom or fully retracted into the sub-assembly, in either case positively locking in place as desired by the operator by means of the partial static pressure applied by the friction members 70,
4. The side handle-mounts 60 which are received by the sub-assembly consisting of the device backing plate 20 and integral backing plate 30, permitting the operator to deploy the handle-mounts in a graduated manner outwardly from the sub-assembly or to fully retract the handle-mounts into the sub-assembly, in either case positively locking the handle-mounts in place as desired by the operator by means of the partial static pressure applied by the friction members 70, 5. The handgrip-strut 50 which is received by the sub-assembly consisting of the device backing plate 20 and integral backing plate 30, permitting the operator to deploy the handgrip-strut 50 in a graduated manner outwardly from the sub-assembly or to fully retract the handgrip-strut into the sub-assembly, in either case positively locking the handgrip-strut in place as desired by the operator by means of the partial static pressure applied by the friction member 70

In broad embodiment, the present invention is a case for electronic devices which provides a number of adjustable grasping and mounting points while concurrently affording a high degree of protection from accidental damage and which may be configured as an accessory device or which may alternatively be made a part of the original equipment.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

What is claimed is:

1. A protective, multifunction enclosure for an electronic device comprising, in combination:
   an impact resistant device backing plate and an integral case backing plate subassembly for receiving an electronic device, said subassembly configured to be in direct communication with the electronic device for securing and protecting the electronic device;
   said subassembly further comprising at least one slidably connected side handle mount, a slidably connected top handle mount and a handgrip strut integrally secured to said subassembly via a series of receiving points;
   wherein each of the said at least one side handle mount, said top handle mount and said handgrip strut are friction fitted to the subassembly and may be placed in a fully deployed state, a partially deployed state or a retracted state;
   wherein in the fully deployed state, all of the said at least one side handle mount, said top handle mount and said handgrip strut are in a fully outwardly deployed position;
   wherein in the partially deployed state, any combination of the said at least one side handle mount, said top handle mount and said handgrip strut are in a fully outwardly deployed position and;
   wherein in the retracted state, all of the said at least one side handle mount, said top handle mount and said handgrip strut are in a fully retracted position within the subassembly; and
   wherein said integral case backing plate further comprises a series of textured waveform detent channels in direct communication with said casing backing plate, whereby the said at least one side handle mount, said top handle mount and said handgrip strut are slidably connected to said integral case backing plate subassembly.

2. The enclosure of claim 1, wherein said at least one side handle mount, said top handle mount and said handgrip strut may be extended outwardly from, or inserted inwardly relative to, said device backing plate and said integral case backing plate subassembly and positioned and locked as desired by means of textured waveform detents.

3. The enclosure of claim 1, wherein the electronic device is an external original equipment electronic device.

4. The enclosure of claim 1, wherein said subassembly has at least one aperture to permit access to an optical lens of an electronic device.

5. The enclosure of claim 1, wherein said integral case backing plate, said device backing plate, said at least one side handle mount, said top handle mount, and said handgrip strut are of a rigid or semi-rigid, machine formed material.

6. The enclosure of claim 1, wherein said at least one slidably connected side handle mount comprises two slidably connected side handle mounts, wherein each of the slidably connected side handle mounts is located on opposite sides of the subassembly.

\* \* \* \* \*